(12) United States Patent
Brewer et al.

(10) Patent No.: US 7,482,680 B2
(45) Date of Patent: Jan. 27, 2009

(54) CUSTOMIZED NON-VOLATILE MEMORY DEVICE PACKAGES

(75) Inventors: Wesley G. Brewer, Menlo Park, CA (US); Eric Bone, San Mateo, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 11/624,610

(22) Filed: Jan. 18, 2007

(65) Prior Publication Data

US 2007/0127281 A1 Jun. 7, 2007

Related U.S. Application Data

(62) Division of application No. 10/909,575, filed on Jul. 29, 2004.

(51) Int. Cl.
| | |
|---|---|
| H01L 23/02 | (2006.01) |
| H01L 23/52 | (2006.01) |
| H01L 23/48 | (2006.01) |
| H01R 13/44 | (2006.01) |
| H01R 13/60 | (2006.01) |
| H05K 7/02 | (2006.01) |
| G06K 7/10 | (2006.01) |
| G06K 19/02 | (2006.01) |
| G06K 19/00 | (2006.01) |

(52) U.S. Cl. .................. 257/678; 257/690; 257/693; 439/131; 439/138; 439/148; 361/752; 235/457; 235/488; 235/492

(58) Field of Classification Search .......... 257/678, 257/690, 693; 439/131, 138, 148; 438/106, 438/125, 126; 361/752; 235/457, 488, 492
See application file for complete search history.

(56) References Cited

U.S. PATENT DOCUMENTS

| | | | |
|---|---|---|---|
| 5,327,371 | A | 7/1994 | Maruyama et al. |
| 5,505,628 | A | 4/1996 | Ramey et al. |
| 5,627,729 | A | 5/1997 | Oldendorf et al. |
| 5,720,158 | A | 2/1998 | Goade, Sr. |
| 5,887,145 | A | 3/1999 | Harari et al. |
| 6,513,720 | B1 | 2/2003 | Armstrong |
| 6,522,534 | B1 * | 2/2003 | Wu ............................ 361/686 |

(Continued)

FOREIGN PATENT DOCUMENTS

BR 9510577 1/1999

(Continued)

OTHER PUBLICATIONS

USPTO, "Office Action," mailed in U.S. Appl. No. 10/909,575 on Apr. 4, 2007, 9 pages.

(Continued)

Primary Examiner—Luan C Thai
(74) Attorney, Agent, or Firm—Davis Wright Tremaine LLP

(57) ABSTRACT

Non-volatile data memory cards, flash drives and other memory devices are customized by manufacturing core memory units all the same and then covering them by outer skins which may be made to have different appearances and/or tactile characteristics. The skins are slid over the core memory units by hand from one end. End users of such memory devices may then select how they will look and feel by separately purchasing covers. Sellers of such memory devices may more easily control how their products look and feel.

11 Claims, 3 Drawing Sheets

U.S. PATENT DOCUMENTS

| | | | |
|---|---|---|---|
| 6,594,154 | B1 | 7/2003 | Brewer et al. |
| 6,612,853 | B2* | 9/2003 | Wu ............................ 439/136 |
| 6,632,997 | B2 | 10/2003 | Hoffman et al. |
| 6,763,410 | B2* | 7/2004 | Yu ............................... 710/74 |
| 6,924,996 | B2 | 8/2005 | Sugawara |
| D511,519 | S | 11/2005 | Bone et al. |
| 6,999,322 | B1* | 2/2006 | Lin ............................ 361/752 |
| 7,152,801 | B2 | 12/2006 | Cuellar et al. |
| 2001/0005902 | A1 | 6/2001 | Bacon et al. |
| 2001/0036524 | A1 | 11/2001 | Anderson |
| 2004/0040871 | A1 | 3/2004 | Kakinoki et al. |
| 2005/0011671 | A1 | 1/2005 | Takiar et al. |

FOREIGN PATENT DOCUMENTS

| | | |
|---|---|---|
| EP | 0 691 625 A1 | 1/1996 |
| EP | 1 030 266 A2 | 8/2000 |
| JP | 2000-113663 | 4/2000 |
| WO | WO2006015028 A1 | 2/2006 |

OTHER PUBLICATIONS

Examination of First Report, European Patent No. 05778056.1, mailed May 29, 2007, 4 pages.

USPTO, "Office Action," corresponding U.S. Appl. No. 10/909,575 on Aug. 31, 2007, 5 pages.

USPTO, "Office Action," corresponding U.S. Appl. No. 10/909,575 on Feb. 12, 2008, 22 pages.

ISA/EPO, "Notification of Transmittal of the International Search Report and the Written Opinion of the International Searching Authority, or the Declaration", mailed in corresponding International Application No. PCT/US2005/026604 mailed Dec. 28, 2005, 12 pages.

USPTO, "Notice of Allowance and Fee(s) Due," corresponding U.S. Appl. No. 10/909,575 on Oct. 2, 2008, 12 pages.

* cited by examiner

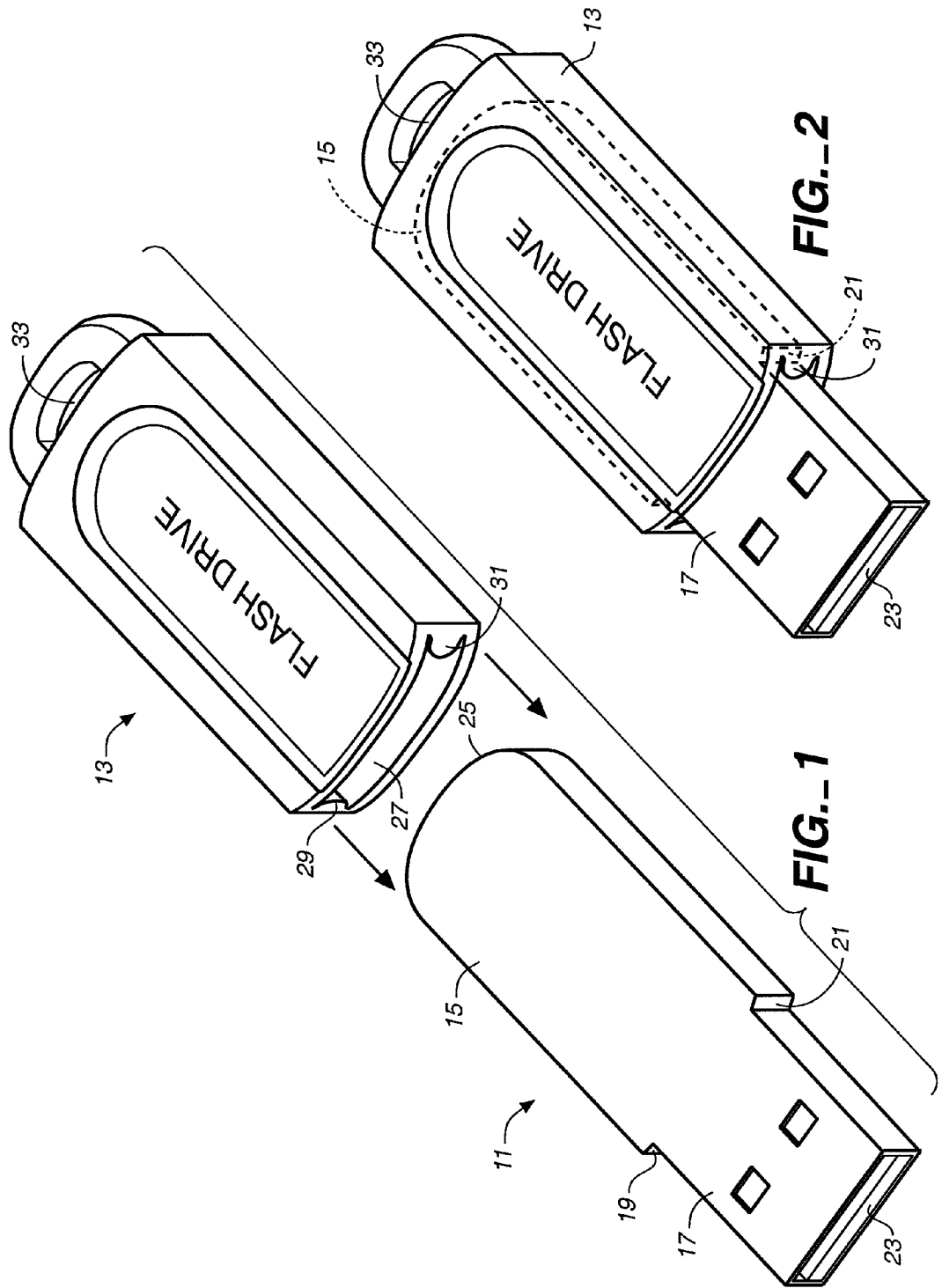

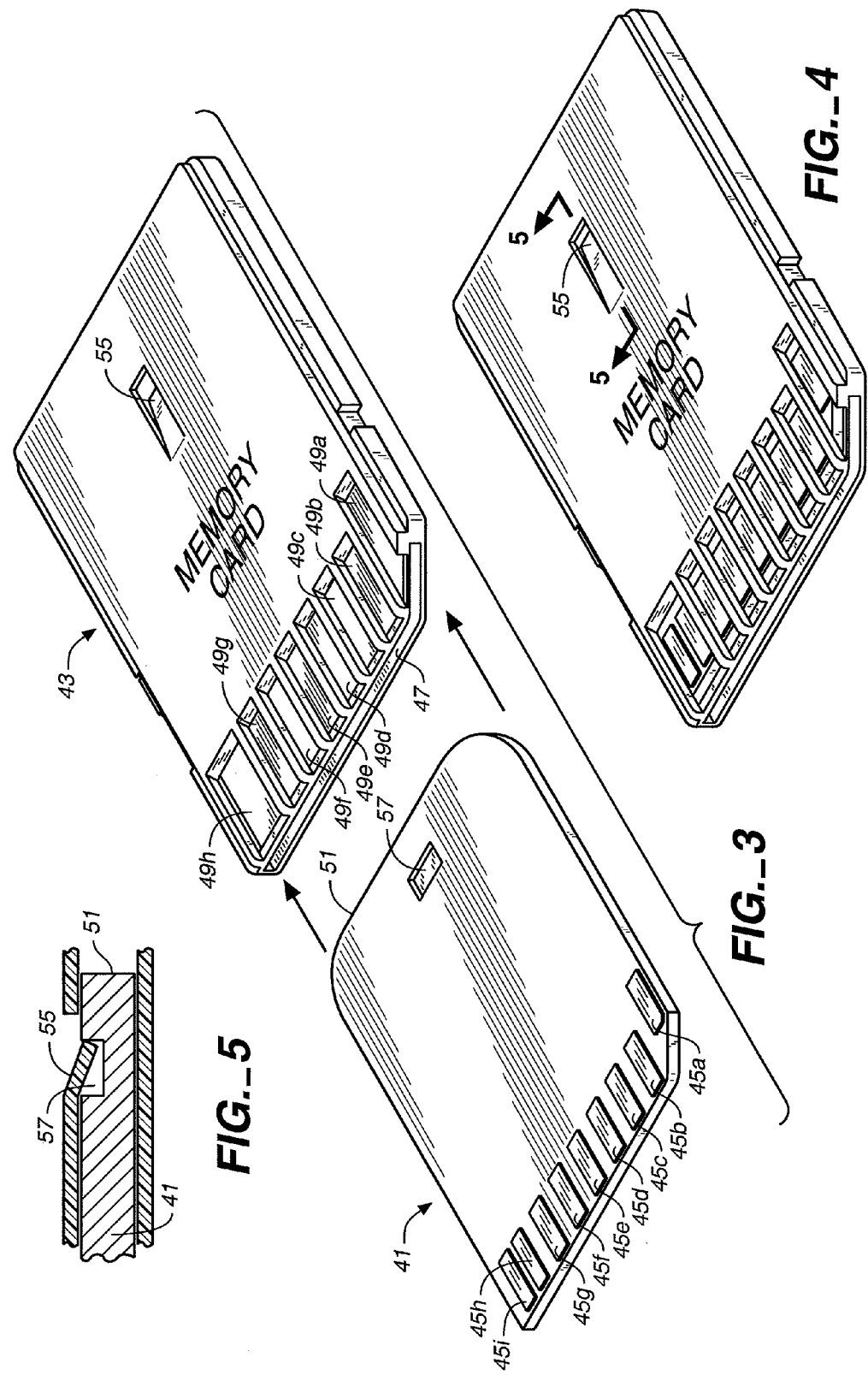

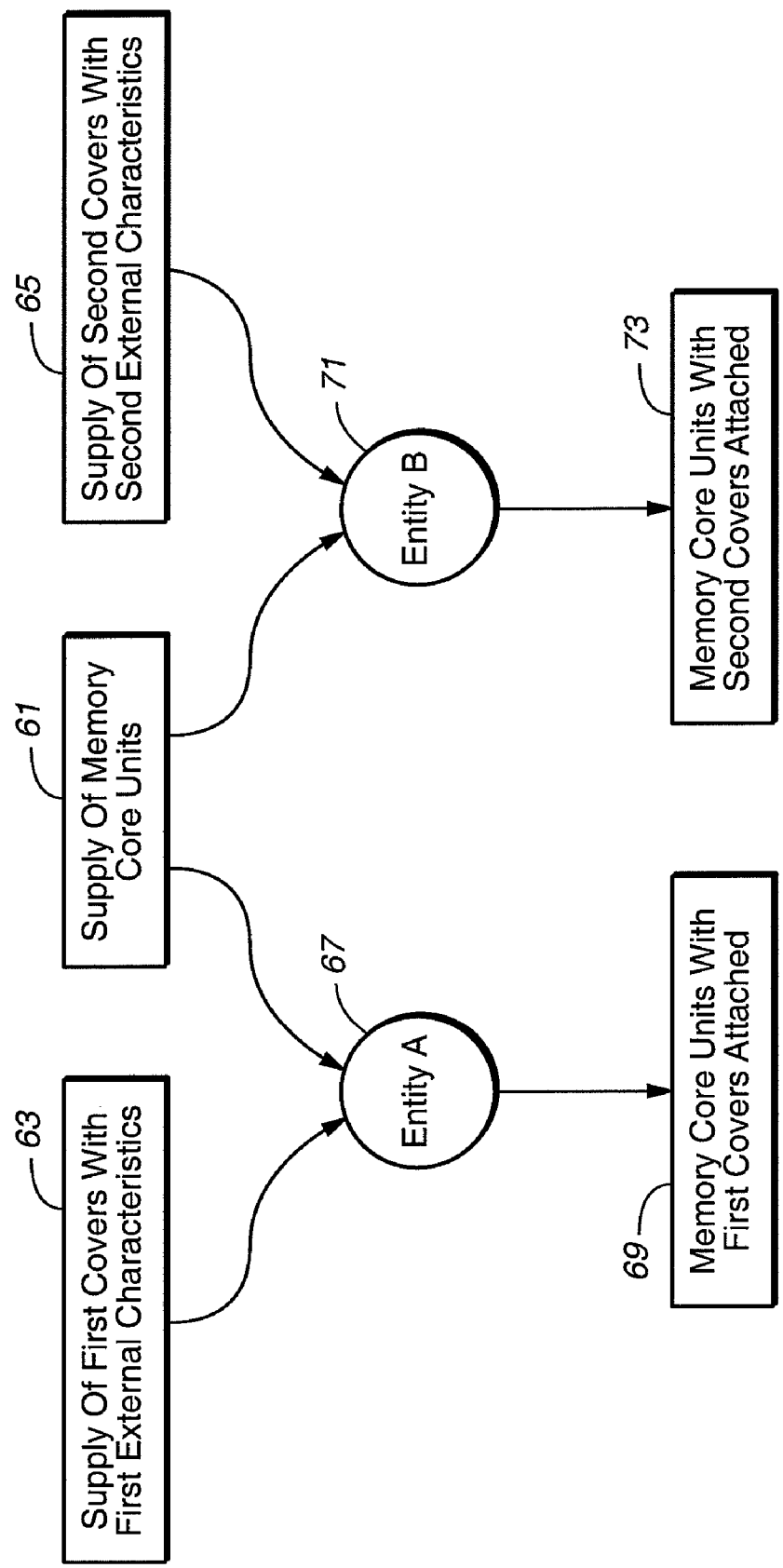
FIG._6

US 7,482,680 B2

CUSTOMIZED NON-VOLATILE MEMORY DEVICE PACKAGES

CROSS-REFERENCE TO RELATED APPLICATIONS

This application is a divisional of application Ser. No. 10/909,575, filed on Jul. 29, 2004, which application is incorporated herein in its entirety by this reference.

This is related to application Ser. No. 10/902,899 entitled "Packaged Memory Devices with Various Unique Physical Appearances" filed on Jul. 29, 2004 by Brewer et al., now publication no. 2006-0022055 A1. This related application is hereby incorporated herein in its entirety for all purposes by this reference.

BACKGROUND OF THE INVENTION

This invention relates generally to the packaging of small, hand-held portable re-programmable non-volatile memory cards, flash drives and other such devices, and, more specifically, to the ability of an end user, seller or manufacturer to customize the outside surfaces of such devices.

Electronic non-volatile memory cards are used with personal computers, notebook computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls operation of the memory cell array and interfaces with a host to which the card connected. Flash memory cards have been commercially implemented according to a number of well-known standards. Popular types include Compact-Flash (CF), MultiMediaCard (MMC), Secure Digital (SD), and Memory Stick, each of which is a sold by SanDisk Corporation, the assignee hereof. These portable, hand-held memory cards are small, the largest length being 50 mm., the largest width 36.4 mm. and the largest thickness being 3.3 mm. More recently, even smaller memory cards have come to the marketplace, including the miniSD and TransFlash cards of SanDisk Corporation.

Other small, hand-held re-programmable non-volatile memory devices have also been made to interface with a computer or other type of host by including a Universal Serial Bus (USB) connector plug. These are especially convenient since personal computers, PDAs and other types of hosts commonly include one or more USB connector receptacles but may not have a receptacle slot that accepts any of above identified standard memory cards. There are several USB flash drive products commercially available from SanDisk Corporation under its trademark Cruzer. USB flash drives are typically shaped differently than the memory cards described above but contain memory with the similar amounts of data storage capacity. The mid-sized Cruzer flash drives have an elongated shape with a length of about 70 mm., including the USB connector plug at one end, a width of about 18 mm. and thickness of about 8 mm. The trend is to make flash drives smaller.

The memory card and flash drive devices usually contain markings on an outside surface that typically give the storage capacity of the memory therein, the name and/or trademark of the seller and possibly other design elements that contribute to the overall appearance of the product. The texture and feel of these small hand-held devices can vary depending upon the nature of the outer material being used.

SUMMARY OF THE INVENTION

The ability is provided for manufacturers, sellers and/or end users of small non-volatile memory devices to customize the outside appearance and/or tactile feel of the devices. A common memory core unit is manufactured in large quantities without an outside cover. Covers (skins) are then separately manufactured with a physical configuration that allows them to be easily attached to core units by hand but in different versions having unique external characteristics such as different appearances and/or tactile feel. The covers with the desired external characteristics are then selected for attachment to the core memory units. The types of memory devices that may be configured in this manner include the memory cards and flash drives discussed above in the Background.

This core/cover configuration allows an end user of memory devices to select and customize his or her devices to have a desired look and feel. Memory core units and covers may be sold separately so that the end user may chose the cover for the device. Once purchased, the end user may also replace the initial cover with another cover having different external characteristics without having to replace the memory core unit, which by that time is likely storing data that the end user would not want to lose. Since the covers can be manufactured and sold for a small fraction of the cost of the core memory units, such exchanges are economically viable.

This core/cover configuration also allows original equipment manufacturers (OEMs) and sellers of memory devices to end users to more easily control the outside appearance and feel of their products. Rather than the manufacturer of memory devices doing special manufacturing runs for individual OEMs and re-sellers in order to meet their requirements for individual looking products, large quantities of identical core memory units may be manufactured and then customized to the requirements of the OEMs and re-sellers by covering them with specially manufactured skins. Each cover can be manufactured to show the name, trademark, characteristics of the memory device and additional information specific to a particular OEM or re-seller.

Additional aspects, advantages, features and details of the present invention are included in the following description of exemplary examples thereof, which description should be taken in conjunction with the accompanying drawings.

BRIEF DESCRIPTION OF THE DRAWINGS

FIG. 1 separately shows a flash memory drive and a cover that fits over the device;

FIG. 2 illustrates the flash memory drive and cover of FIG. 1 fit together;

FIG. 3 separately shows a memory card and a cover that fits over the card;

FIG. 4 illustrates the memory card and cover of FIG. 3 fit together;

FIG. 5 is a cross-sectional view of the combination of FIG. 4, taken at section 5-5 thereof; and FIG. 6 is a flow diagram that shows an example use of multiple covers and associated memory devices.

DETAILED DESCRIPTION OF EXEMPLARY EMBODIMENTS

A first embodiment is illustrated in FIGS. 1 and 2. A core memory unit 11 is in the form of a flash drive, such as that utilized in the SanDisk Cruzer flash drive products discussed in the Background. An elongated main body portion 15 includes one or more integrated circuit chips (not shown)

providing an array of re-programmable non-volatile memory cells and a memory controller. A USB connector plug 17 extends from one end of the body 15, having the same thickness but a smaller width. The smaller connector 17 is centered across the width of the body 15 in order to form shoulders 19 and 21 on the body 15. The shoulders 19 and 21 are positioned on opposite sides of the connector 17 where it joins the body 15. The memory system within the body 15 is connected to four contacts (not shown) of the USB connector 17, two for power and two for the transfer of data into and out of the memory. These contacts are positioned on the top surface of a dielectric layer 23 within the connector plug 17. An outside of the body 15 and connector 17 are preferably made of a single thin layer of metal, such as aluminum, that has been formed into the shape shown. Top and bottom surfaces extend in planes across both of the body 15 and connector 17. An end 25 of the body 15 is preferably curved, as illustrated in FIGS. 1 and 2, but this end may alternatively be made straight, thereby resulting in the unit 11 being totally rectangular in shape.

A cover 13 is formed to have an inside cavity with a shape complementary to that of the outside surface of the body 15 so that the cover fits tightly around the body when inserted over it. In this embodiment, this cavity is totally enclosed except for an opening 27 through which the end 25 of the body 15 is inserted. Resilient tabs 29 and 31 extend into the cavity at the opening 27 from opposite sidewalls. When the body 15 is inserted through the opening 27 of the cover 13, these tabs 29 and 31 bend backwards until they are positioned in front of the shoulders 19 and 21 of the body 15, at which point the tabs snap outward again to secure the cover 13 on the body 15. The rounded shape of the body end 25 makes this insertion easier but may not always be needed.

The cover 13 is preferably made from plastic, rubber or other moldable material, independently of the flash drive 11. It is also desirable that the cover 13 have some degree of flexibility so that the inside walls of its cavity tightly conform to the outside walls of the body 15, in the nature of a skin for the memory unit body. The walls of the cover 13 are preferably made to have a thickness between 0.5 and 2.0 millimeters in the areas that contact top, bottom and side walls of the body 15. No adhesive need be used to attach the cover 13 to the body 15. The end of the cover opposite its opening 27 may optionally be extended in a manner to form an opening 33 that accepts a neck chain, key ring, and the like, to allow an individual to carry the memory device when the cover is attached.

One of the criteria for choosing a material for the cover 13 is the tactile feel of its outside surface to the user. This tactile feel may also be controlled by treatment of the outside surface of the cover 13, such as its roughening, smoothing, and the like. Two or more covers with a different outside surface feel may be made so that a manufacture, re-seller or end-user may choose among covers with different outside mechanical characteristics, according to personal taste.

Two or more such covers may also be made to have different visual characteristics. The covers may be made of optically transparent material, to have different uniform visible colors, different colors in patterns, and the like. The covers may also have different graphical patterns formed on them, or none at all. Various different indicia may be printed or otherwise applied on different covers, including alpha-numeric characters. In one specific form, the cover 13 may be made of optically transparent material with solid lettering on an outside surface that reflects from and/or casts a shadow on the underlying metal surface of the unit 11, as described in the simultaneously filed patent application cross-referenced above.

An end-user may then choose a cover based on his or her personal taste when purchasing a new memory device, or substitute one cover for another. The tabs 29 and 31 of the cover 13 may be bent outward from the shoulders 21 of the body 11, by the use of fingernails or an appropriate tool, to allow the cover to be pulled off the body. No matter which of many available covers 13 may be chosen for their tactile or visual characteristics, the core memory unit 11 remains the same. The relatively expensive core memory unit 11, when compared to the cover 13, may then be manufactured in large quantities and customized by the end-user, or even by a manufacturer or re-seller of memory devices.

Original equipment manufacturers (OEMs) and re-sellers of memory devices often like to apply their own names, trademarks, and the like, the devices they sell. The separate cover 13 can then be conveniently used for this purpose. An individual OEM or re-seller manufactures, or has manufactured for it, covers with its name and any trademarks on them, which are then attached to the core memory units 11 by hand or a simple machine. Different covers with different graphical designs, trademarks, and the like, or even different tactile feels, may be also be used by a single business for different product lines. In any of these cases, the common core memory units 11 are purchased in bulk without any difference between them except their memory capacity. An OEM or re-seller that attaches customized covers will normally offer two or more memory device products with different data storage capacities of their memories, and therefore at different prices.

As is evident from a second embodiment illustrated in FIGS. 3-5, the same concept can be used with memory cards. In this example, a core memory unit 41 is inserted into a cover 43 (FIG. 3) to result in a Secure Digital (SD) card (FIG. 4), a commercial form of memory card. The core memory unit 41 contains the one or more integrated circuit chips necessary to form the data storage system. The unit 41 is preferably made of molded plastic. The electronic system communicates to the outside world through nine electrical contacts 45a-i attached to a surface of the unit 41 along one end thereof. A cavity within the cover 43 has a shape that is complementary to the core unit 41, with an opening 47 into which the core unit 41 is inserted from an end 51 that is opposite to the end carrying the contacts 45. Eight apertures 49a-h exist in a top wall of the cover 43, opening to the cavity within, at positions aligned with the contacts 45a-i of the core unit 41. The contacts 45a-i are then accessible through respective apertures 49a-h when the core unit 41 is positioned within the cover 43 (aperture 49h exposes two contacts 45h and 45i), as shown in FIG. 4. Walls between the apertures define recesses for the contacts, according to specifications of the SD memory card.

In order to retain the core unit 41 within the cover 43, in this specific example, the top surface of the cover includes a resilient detent 55 that normally depends downward into the cavity within. This is best seen by the cross-sectional view of FIG. 5. The core memory unit 41 has a recess 57 in its top surface into which the detent 55 snaps when the unit 41 is inserted into the cover 43 through its end opening 47. The relative positions of the detent 55 and recess 57 are such that the unit 41 is maintained fully within the cavity of the cover 43, with the unit surface contacts 45a-i aligned with the corresponding apertures 49a-h of the cover. The core memory unit 41 may be released by the use of a small tool to raise the detent up out of the unit's recess 57, which then allows the unit 41 to be withdrawn from the cover 43. Travel of the core unit 41 into the cavity of the sleeve 43 through the opening 47 is restrained by an appropriate stop or end surface (not shown) formed in the cavity.

Different covers 43 can then be provided for use with the same core units 41, in the same manner as described above with respect to the first embodiment. Individual covers are made to have a visual appearance, tactile feel, and other external characteristics according to the tastes and desires of any of an end-user, a re-seller, an OEM or a manufacturer. In one specific form, the cover 43 may be made of optically transparent material with solid lettering on an outside surface that reflects from and/or casts a shadow on the surface of the core unit 41, as described in the simultaneously filed patent application cross-referenced above. According to that cross-referenced application, reflective foil would be attached to the surface of the core memory unit 41, which would then be visible through the cover 43. This foil may include a hologram on its exposed surface, such as a diffusely reflecting rainbow hologram.

A chart of FIG. 6 illustrates some of the commercial possibilities presented by use of covers separate from core memory units. A common supply 61 of memory core units (core 11 of FIGS. 1-2, or core 41 of FIGS. 3-5, as examples) having a particular data storage capacity are used to form complete memory devices. A supply 63 of first covers (respective cover 13 of FIGS. 1-2, or cover 43 of FIGS. 3-5, as examples) provides one choice to be combined with the core units. A supply 65 of second covers provides another choice. The first and second covers are different in some outer characteristic, such as their visual appearances, tactile feel, and others discussed above.

An entity A (67) then forms complete memory devices, indicated at 69, by placing the covers of 63 on the core units of 61. Similarly, an entity B (71) places the covers of 65 onto the same core units of 61 to form complete memory devices, as indicated at 73, that therefore have perceptually different outer characteristics than the memory devices indicated at 69. The entities A and B may be different end-user individuals that have customized their memory devices to their different tastes. Or the entities A and B can be different businesses that manufacture or sell complete memory devices, and which have customized the outer characteristics to their different business requirements.

Although the various aspects of the present invention have been described with respect to specific exemplary embodiments thereof, it will be understood that the present invention is entitled to protection within the full scope of the appended claims.

It is claimed:

1. A memory system, comprising:
   a memory unit having one or more integrated circuit chips providing a re-programmable non-volatile data memory enclosed within a housing and having electrical contacts at a first edge thereof accessible from the outside of the housing being connected therewith,
   a plurality of covers having different identifiable external characteristics, the covers being individually shaped to surround an outside surface of at least a portion of the housing of the memory unit in tight conformance therewith and having an opening at an end that allows a second edge of the housing opposite the first edge to be inserted therein to a defined position within the cover such that the electrical contacts remain accessible from outside the housing, and
   mating elements on an outside of the housing and on an inside of the cover that removably hold the housing at the defined position within the cover.

2. The memory system of claim 1, wherein the different external characteristics of the plurality of covers include different visual designs on at least one outside surface of the covers.

3. The memory system of claim 1, wherein the different external characteristics of the plurality of covers include different indicia on at least one outside surface of the covers.

4. The memory system of claim 1, wherein the different external characteristics of the plurality of covers include different colors on at least one outside surface of the covers.

5. The memory system of claim 1, wherein the memory unit is a flash drive having an elongated body with the electrical contracts in a plug that extends from one end thereof, at least one dimension of the plug being less in cross-section than that of the body where they join together, thereby forming shoulders on the body that extend outward on opposite sides of the plug, and wherein the covers individually have resilient tabs on inward facing walls adjacent its end opening that allow the sleeve to be slid over the body with the tabs compressed to the defined position wherein the tabs open inward adjacent the shoulders to hold the sleeve against movement on the flash drive, the shoulders and tabs forming the mating elements that hold the memory unit housing within the cover.

6. The memory system of claim 1, wherein the memory unit is a memory card with an outer enclosure that is molded around the integrated circuit chips and the electrical contacts are positioned on an outer surface of the card along one end thereof so that an opposite end of the memory card is slidable into the cover end opening to position apertures in the cover over the outside contacts on the memory card, whereby the contacts are accessible through the cover apertures.

7. The memory system of claim 6, wherein the mating elements include a detent on an inside surface of the cover and a recess on an outside surface of the memory card positioned to receive the detent when the card is inserted to the defined position within the cover.

8. The memory system of claim 1, wherein the cover includes an extension from an end of the memory device opposite the end opening and a hole in the extension to accept a chain or ring therethrough.

9. The memory system of claim 5, wherein the tabs have a resilience that allows the tabs to be-bent outward from the end of the cover away from the shoulders of the body in order to release the cover from the memory unit housing, whereby the housing may be removed from the cover.

10. The memory system of claim 7, wherein the detent is manipulatable in order to allow it to be moved out of the recess on the memory card, whereby the memory card may be withdrawn from the cover.

11. The memory system of claim 1, wherein the mating elements are manipulatable in order to release the housing from the cover, whereby the housing may then be removed from the cover.

* * * * *